(12) United States Patent
Lee et al.

(10) Patent No.: US 8,981,396 B2
(45) Date of Patent: Mar. 17, 2015

(54) SEMICONDUCTOR LIGHT EMITTING DEVICE, LIGHT EMITTING MODULE, AND ILLUMINATION APPARATUS

(71) Applicant: Samsung Electronics Co., Ltd., Gyeonggi-do (KR)

(72) Inventors: Jin Hyun Lee, Gyeonggi-do (KR); Bum Joon Kim, Seoul (KR); Seung Wan Chae, Gyeonggi-do (KR); Chan Mook Lim, Gyeonggi-do (KR); Jong Ho Lee, Gyeonggi-do (KR); Jin Hwan Kim, Gyeonggi-do (KR); Su Hyun Jo, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/770,710

(22) Filed: Feb. 19, 2013

(65) Prior Publication Data
US 2013/0214308 A1 Aug. 22, 2013

(30) Foreign Application Priority Data

Feb. 17, 2012 (KR) ........................ 10-2012-0016456

(51) Int. Cl.
*H01L 29/207* (2006.01)
*H01L 33/08* (2010.01)
*H01L 27/15* (2006.01)
(Continued)

(52) U.S. Cl.
CPC .............. *H01L 33/08* (2013.01); *H01L 27/156* (2013.01); *H01L 33/38* (2013.01); *H01L 33/62* (2013.01); *H01L 2224/48091* (2013.01); *F21V 29/2206* (2013.01); *F21V 3/00* (2013.01); *F21K 9/1355* (2013.01); *F21V 15/011* (2013.01); *F21Y 2101/02* (2013.01)
USPC .......................................................... 257/93

(58) Field of Classification Search
CPC .... H01L 25/0753; H01L 27/15; H01L 27/156
USPC ................ 257/88, 93, 94, E21.002, E33.005; 438/47
See application file for complete search history.

(56) References Cited

U.S. PATENT DOCUMENTS

| | | | |
|---|---|---|---|
| 5,146,465 A * | 9/1992 | Khan et al. ................. | 372/45.01 |
| 2004/0041156 A1* | 3/2004 | Tsuda et al. .................... | 257/79 |
| 2004/0251818 A1* | 12/2004 | Duggal et al. ................ | 313/504 |
| 2009/0283795 A1* | 11/2009 | Miki et al. ..................... | 257/103 |
| 2010/0117056 A1* | 5/2010 | Nagai ............................. | 257/13 |

FOREIGN PATENT DOCUMENTS

| | | |
|---|---|---|
| JP | 2006-210824 A | 8/2006 |
| KR | 20050104151 A | 11/2005 |

(Continued)

*Primary Examiner* — Yu-Hsi D Sun
*Assistant Examiner* — Christina Sylvia
(74) *Attorney, Agent, or Firm* — McDermott Will & Emery LLP

(57) ABSTRACT

A semiconductor light emitting device includes a substrate, a semiconductor laminate having a base semiconductor layer, a first conductivity-type semiconductor layer, an active layer, and a second conductivity-type semiconductor layer sequentially formed on the substrate and divided by an isolation region to provide a plurality of light emitting cells, an intermediate separation layer interposed between the base semiconductor layer and the first conductivity-type semiconductor layer, a plurality of first and second electrodes connected to the first and second conductivity-type semiconductor layers, respectively, of the plurality of light emitting cells, and a wiring unit connecting the first and second electrodes of different light emitting cells.

20 Claims, 7 Drawing Sheets

(51) Int. Cl.
*H01L 33/38* (2010.01)
*H01L 33/62* (2010.01)
*F21V 29/00* (2006.01)
*F21V 3/00* (2006.01)
*F21K 99/00* (2010.01)
*F21V 15/01* (2006.01)
*F21Y 101/02* (2006.01)

(56) References Cited

FOREIGN PATENT DOCUMENTS

KR 20090045877 A 5/2009
KR 20110098874 A 9/2011

\* cited by examiner

SEMICONDUCTOR LIGHT EMITTING DEVICE, LIGHT EMITTING MODULE, AND ILLUMINATION APPARATUS

CROSS-REFERENCE TO RELATED APPLICATIONS

This application claims the priority of Korean Patent Application No. 10-2012-0016456 filed on Feb. 17, 2012, in the Korean Intellectual Property Office, the disclosure of which is incorporated herein by reference.

BACKGROUND OF THE INVENTION

1. Field of the Invention

The present disclosure relates to a semiconductor light emitting device and, more particularly, to a semiconductor light emitting device having a structure in which a plurality of light emitting cells are arranged, and a light emitting module and an illumination apparatus including the same.

2. Description of the Related Art

In general, a semiconductor light emitting device, having advantages as a light source in terms of output, efficiency and reliability, has been actively studied and developed as a high output, high efficiency light source that may be used in a backlight of a display device or in various illumination apparatuses.

In order to use an LED as an illuminating light source commercially, an LED may be required to have a high degree of luminance efficiency and incur low manufacturing costs, while providing a desired high level of output. However, if a rated current is increased to thereby obtain a high degree of luminous flux in an LED chip having the same area as a high output LED, current density may also be increased to degrade luminance efficiency, and heating of the device may accelerate the luminance efficiency thereof (i.e., luminance efficiency may be degraded due to an increase in current density and a degradation of luminance efficiency may be accelerated due to heating of the device).

Meanwhile, in order to alleviate the problem of current density, a method of increasing the area of an LED chip may be considered, but in this case, it may be difficult to implement a uniform current density across the entire area of the chip and a high production yield may be difficult to obtain.

Thus, as a solution to this problem, a method of implementing an epitaxial layer, for an LED grown on a single substrate, to form a plurality of LED cells through an isolation process and connecting the plurality of LED cells may be taken into consideration. Here, during the isolation process, slopes of surfaces of the respective LED cells are required to be sufficiently gentle to allow a metal for connecting the plurality of LED cells to be easily deposited thereon. In this case, however, since a large amount of the epitaxial layer may be removed during the isolation process, an effective light emitting area (i.e., the area of an active layer) may be drastically reduced.

SUMMARY

Therefore, in the art, a multi-cell semiconductor light emitting device having enhanced luminance efficiency through minimizing a reduction in an effective light emitting area through an isolation process, and a manufacturing method and application product thereof are required.

According to an aspect of the present disclosure, there is provided a semiconductor light emitting device including: a substrate; a semiconductor laminate having a base semiconductor layer, a first conductivity-type semiconductor layer, an active layer, and a second conductivity-type semiconductor layer sequentially formed on the substrate and divided by an isolation region to provide a plurality of light emitting cells; an intermediate separation layer interposed between the base semiconductor layer and the first conductivity-type semiconductor layer in order to electrically separate the base semiconductor layer and the first conductivity-type semiconductor layer; a plurality of first and second electrodes connected to the first and second conductivity-type semiconductor layers, respectively, of the plurality of light emitting cells; and a wiring unit connecting the first and second electrodes of different light emitting cells such that the plurality of light emitting cells are connected.

The intermediate separation layer may be a material layer having an energy band gap equal to or greater than that of the first conductivity-type semiconductor layer.

The semiconductor laminate may be a nitride semiconductor, and the intermediate separation layer may be a nitride layer having an energy band gap equal to or greater than that of the first conductivity-type semiconductor layer. The intermediate separation layer may be a nitride layer satisfying $Al_xGa_{1-x}N$ ($0.3 \leq x \leq 1$).

The base semiconductor layer may include an intentionally undoped semiconductor layer. The base semiconductor layer may include the same semiconductor layer as the first conductivity-type semiconductor layer.

The base semiconductor layer and the first conductivity-type semiconductor layer may be n-type nitride semiconductor layers, and the intermediate separation layer may be a nitride layer doped with at least one element selected from the group consisting of iron (Fe), chromium (Cr), zinc (Zn), carbon (C), oxygen (O), and hydrogen (H).

The n-type nitride semiconductor layer may be an n-type nitride semiconductor layer doped with silicon (Si), and the intermediate separation layer may be a nitride layer co-doped with carbon (C) and silicon (Si).

The intermediate separation layer may have a structure in which two types of thin films, having different respective refractive indices, are repeatedly alternately stacked. The two types of thin films may be nitride thin films.

The isolation region may be formed such that at least the intermediate separation layer is exposed.

An insulating layer may be formed on a lateral surface of each light emitting cell to prevent the wiring unit and an undesired region of each light emitting cell from being electrically connected.

The wiring unit may connect the plurality of light emitting cells to allow the plurality thereof to be driven at a DC voltage or an AC voltage.

The semiconductor light emitting device may further include: first and second bonding pads, wherein the wiring unit includes a sub-connection wiring connected to any one of the first and second electrodes of the plurality of light emitting cells and a main connection wiring connecting the sub-connection wiring and the first or second bonding pad.

The substrate may be a conductive substrate or an insulating substrate.

Each of the plurality of light emitting cells may include a plurality of first and second electrodes.

According to another aspect of the present disclosure, there is provided a light emitting module and an illumination apparatus having the foregoing semiconductor light emitting device.

According to another aspect of the present disclosure a method of forming a light emitting device having a first light emitting cell and a second light emitting cell is provided comprising providing a substrate and forming a base semiconductor layer on the substrate. An intermediate separation layer is formed on the base semiconductor layer. A first conductivity-type semiconductor layer is formed on the intermediate separation layer, and an active layer is formed on the first semiconductor layer. A second conductivity-type semiconductor layer is formed on the active layer, thereby forming a semiconductor laminate. An isolation region is formed in the semiconductor laminate to expose a portion of the intermediate separation layer, thereby dividing the semiconductor laminate into a first light emitting cell and a second light emitting cell. A first electrode is formed one each upper surface of the first conductivity-type semiconductor layer of the first light emitting cell and the first conductivity-type semiconductor layer of the second light emitting cell. A second electrode on each upper surface of the second conductivity-type semiconductor layer of the first light emitting cell and the second conductivity-type semiconductor layer of the second light emitting cell. An insulating layer is formed on the first light emitting cell and second light emitting cell, and a wiring is formed connecting the first electrode of the first light emitting cell and the second electrode of the second light emitting cell.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
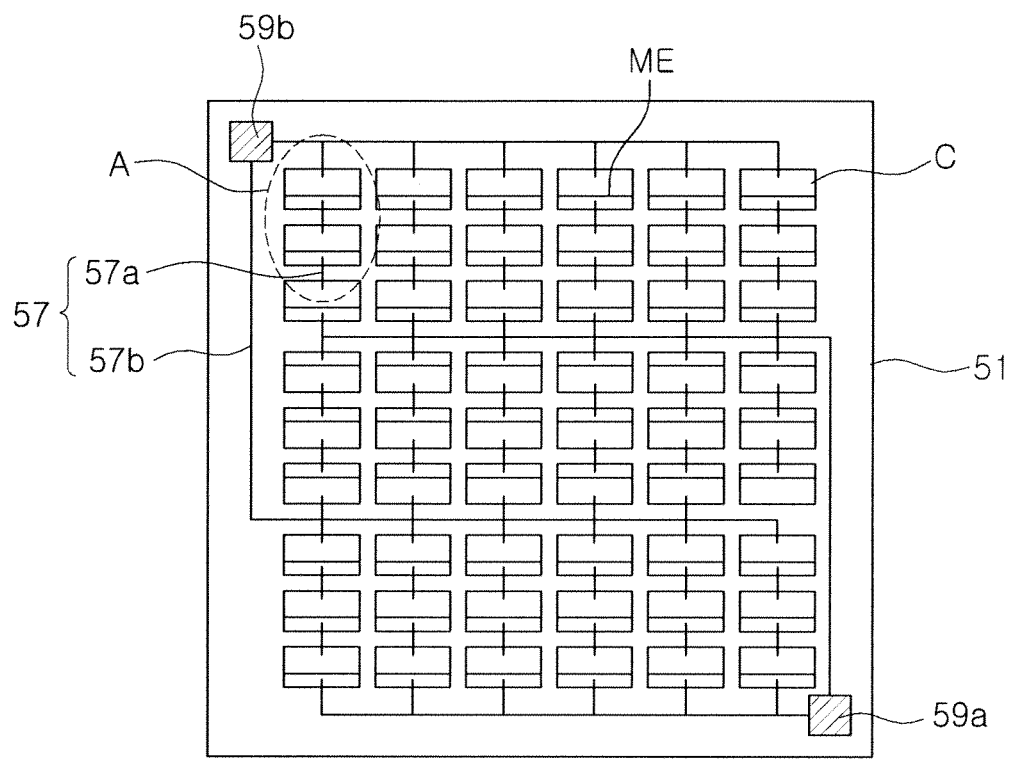
FIG. 1 is a plan view of a semiconductor light emitting device according to an embodiment of the present disclosure.

Embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like components.

Figure 2:
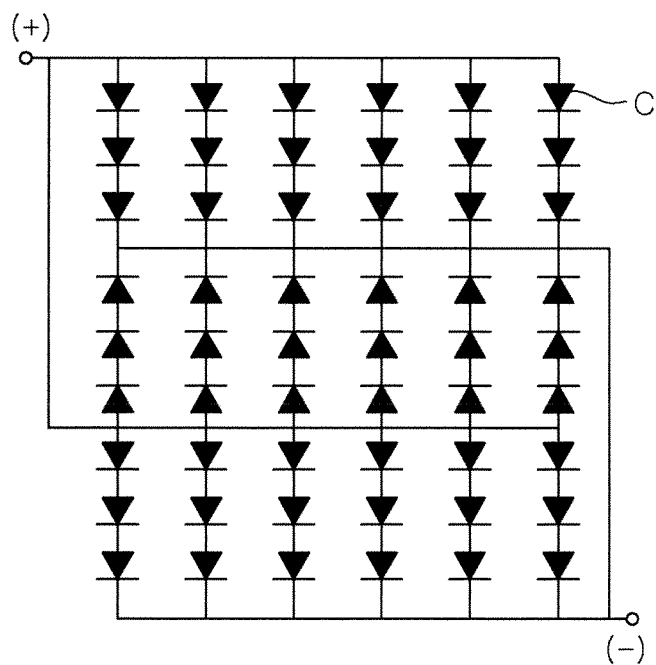
FIG. 2 is an equivalent circuit diagram of the semiconductor light emitting device illustrated in FIG. 1.

FIG. 1 is a plan view of a semiconductor light emitting device according to an embodiment of the present disclosure, and FIG. 2 is an equivalent circuit diagram of the semiconductor light emitting device illustrated in FIG. 1.

As illustrated in FIG. 1, a semiconductor light emitting device 50 according to an embodiment of the present disclosure includes a substrate 51, and a plurality of light emitting cells C formed on an upper surface of the substrate 51.

In the present embodiment, the plurality of light emitting cells C may be connected by a wiring unit 57. The semiconductor light emitting device 50 includes first and second bonding pads 59a and 59b.

The plurality of light emitting cells C are arranged in a 6×9 grid pattern. As illustrated in FIG. 2, the light emitting cells C are arranged in six columns. Also, respective columns have an array in which three light emitting cells C are connected in series and groups of three connected light emitting cells C are connected in threes. Three serially connected light emitting cells C and three other serially connected light emitting cells C may be connected in parallel.

In order to implement such wiring connections, the wiring unit 57 may include a sub-connection wiring 57a, directly connected to the light emitting cells C and a main connection wiring 57b connecting the sub-connection wiring 57a to the first and second bonding pads 59a and 59b. As shown in FIG. 1, all of three light emitting cells connected in series may be connected in parallel by the wiring unit 57 (please see the equivalent circuit diagram of FIG. 2).

The first and second bonding pads 59a and 59b may be formed of a known metal/alloy layer such as a chromium/gold (Cr/Au) layer, but the present disclosure is not limited thereto. The wiring unit 57 may be made of a metal such as aluminum (Al) or silver (Ag) having excellent levels of reflectance and conductivity.

The array of the LED cells and the wiring unit 57 may be variably modified according to requests such as desired voltage standard and output, and the like. For example, a voltage standard of the semiconductor light emitting device may be designed by selecting a driving voltage of each of light emitting cells and the number of light emitting cells connected in series, and a desired output may be obtained by adjusting a unit output of the light emitting cells and a total number of driven light emitting cells.

Figure 3:
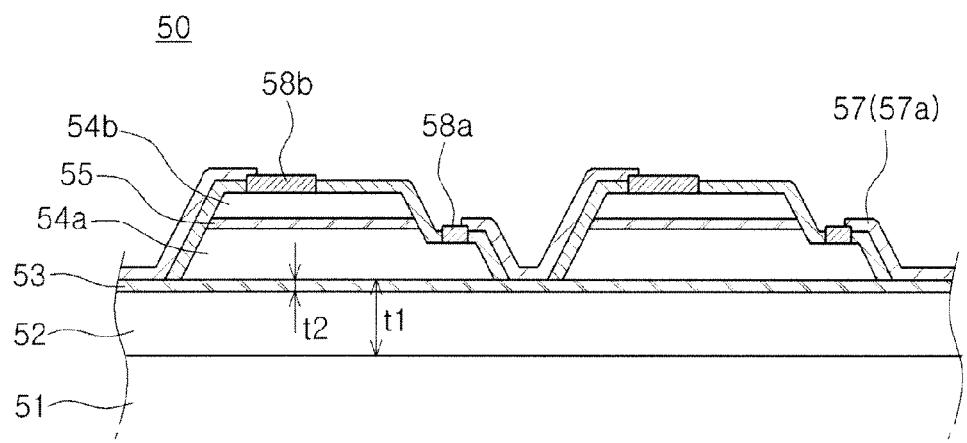
FIG. 3 is a cross sectional view of a connection portion (area "A") between light emitting cells of the semiconductor light emitting device illustrated in FIG. 1.

As illustrated in FIG. 3, the plurality of light emitting cells C may be obtained by separating a semiconductor laminate including a base semiconductor layer 52, a first conductivity-type semiconductor layer 54a, an active layer 55, and a second conductivity-type semiconductor layer 54b sequentially formed on an upper surface of a substrate 51.

The semiconductor laminate employed in the present embodiment includes an intermediate separation layer 53 formed between the base semiconductor layer 52 and the first conductivity-type semiconductor layer 54a. The intermediate separation layer 53 may be a material layer having an energy band gap equal to or greater than that of the first conductivity-type semiconductor layer 54a to separate the base semiconductor layer 52 and the first conductivity-type semiconductor layer 54a.

The intermediate separation layer 53 is formed on the base semiconductor layer 52 to provide a crystal growth surface for growing the first conductivity-type semiconductor layer 54a thereon. In this context, the intermediate separation layer 53 is preferably a crystal growth layer that may be formed together with the base semiconductor layer 52 and the first conductivity-type semiconductor layer 54a through a successive growth process.

In a particular example, the semiconductor laminate may be a nitride semiconductor. In this case, the intermediate separation layer 53 may be a nitride layer having an energy band gap equal to or greater than that of the first conductivity-type semiconductor layer 54a. Preferably, the energy band gap of the intermediate separation layer 53 is greater than that of the first conductivity-type semiconductor layer 54a. For example, the intermediate separation layer 53 may be a nitride layer satisfying $Al_xGa_{1-x}N$ ($0.3 \leq x \leq 1$) having a great band gap. In order to guarantee sufficient insulation properties, a thickness t2 of the intermediate separation layer 53 may be about 0.5 µm or greater.

In detail, in order to form the base semiconductor layer 52 on a sapphire substrate in an MOCVD chamber, a gallium source together with a nitrogen source is supplied to grow a GaN layer, and in order to subsequently form the intermediate separation layer 53, the supply of the gallium source is stopped and an aluminum source is supplied to grow an AlN layer. Subsequently, in order to grow the first conductivity-type semiconductor layer 54a, the supply of the aluminum source is stopped and a gallium source together with an n-type dopant is supplied to form an n-type GaN layer.

In order to secure higher electrical insulation properties, the intermediate separation layer 53 may be a nitride layer doped with at least one element selected from the group consisting of iron (Fe), chromium (Cr), zinc (Zn), carbon (C), oxygen (O), and hydrogen (H). Such a dopant may serve to restrain unintentional action of an n-type dopant such that the intermediate separation layer 53 does not have n-type conductivity through unintentional doping.

For example, when the first conductivity-type semiconductor layer 54a is a nitride semiconductor layer doped with silicon (Si), a carbon (C) dopant may be added to be co-doped to form the intermediate separation layer 53 as a nitride layer having carbon (C) and silicon (Si) co-doped therein.

The base semiconductor layer 52 may include an intentionally undoped semiconductor layer. Alternatively, the base semiconductor layer 52 may include the same material as the first conductivity-type semiconductor layer 54a. In this case, an environment in which the intermediate separation layer 53 may easily have conductivity by the dopant remaining in a chamber is established. Thus, in order to prevent this, the foregoing dopant may be additionally doped to guarantee desired electrical insulation properties.

The light emitting cells C may be mesa-etched to provide a region in which a first electrode 58a is provided. In each light emitting cell C illustrated in FIG. 1, the region obtained through mesa-etching is indicated by "ME". A second electrode 58b is formed on an upper surface of the second conductivity-type semiconductor layer 54b. The wiring unit 57 (especially, the sub-connection wiring 57a) electrically connects the first electrode 58a and the second electrode 58b of two adjacent light emitting cells to implement the wiring connection illustrated in FIG. 1.

As illustrated in FIG. 3, an isolation region is formed such that the intermediate separation layer 53 of each of the plurality of light emitting cells C is exposed, whereby the plurality of light emitting cells C may be obtained by separating the semiconductor laminate. In this manner, since the light emitting cells can be electrically separated even in the case that the semiconductor laminate is only separated to the degree that the intermediate separation layer 53 is exposed, reducing the depth of an isolation groove.

In the present embodiment, by employing the intermediate separation layer 53, the depth of an isolation groove may be reduced to increase an effective light emitting area of the semiconductor light emitting device 50, namely, the sum total of the respective cell active layer areas, and as a result, luminous efficiency can be significantly enhanced.

The effect of the effective light emitting area in the wake of the introduction of the intermediate separation layer will be described with reference to FIGS. 3 and 4 so as to be more easily understood.

In general, in a multi-cell light emitting device, in order to guarantee independent driving of each light emitting cell, the first conductivity-type semiconductor layer 54a of each light emitting cell is required to be completely separated.

Figure 4:
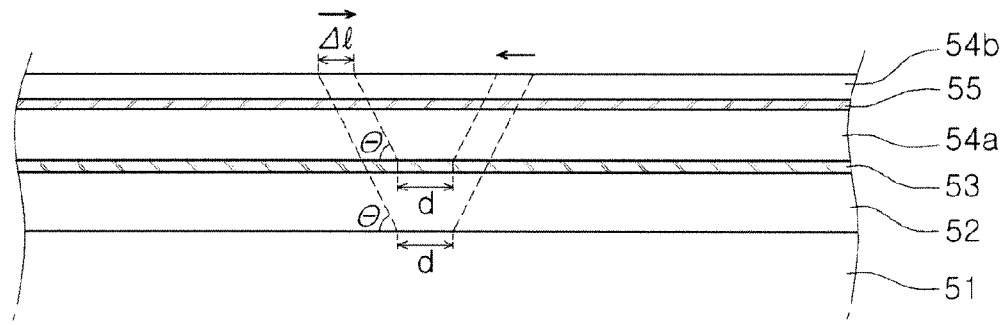
FIGS. 4 and 5 are schematic views illustrating a principle by which an effective light emitting area (active layer area) may be increased by an intermediate separation layer employed in an embodiment of the present disclosure.

In the related art, as illustrated in FIG. 4, an isolation region is formed down to the substrate 51 in order to completely separate the first conductivity-type semiconductor layer 54a. In comparison, in the present embodiment, the intermediate separation layer 53 interposed between the first base semiconductor layer 52 and the first conductivity-type semiconductor layer 54a guarantees electrical insulation properties therebetween, so even in the case that the isolation region is formed down to the intermediate separation layer 53, the light emitting cells C can be electrically separated.

Figure 5:
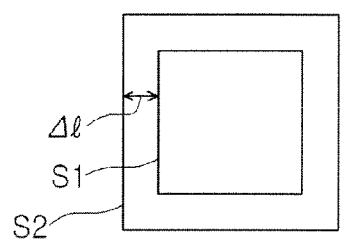

As a result, when it is assumed that the gradient of respective light emitting cells C and an interval therebetween, i.e., the conditions for easily depositing the wiring unit 57, are maintained to be uniform, when the isolation region is only formed down to the intermediate separation layer 53, the portion Δl sacrificed for the isolation region in the related art may be rescued as shown in FIG. 4. Namely, as illustrated in FIG. 5, when the area of the active layer 55 is assumed to have a quadrangular shape, the introduction of the intermediate separation layer 53 can increase the area of the light emitting cell C from the area S1 to the area S2.

In this manner, the introduction of the intermediate separation layer 53 to guarantee electrical insulation between the first conductivity-type semiconductor layer 54a and the base semiconductor layer 52 can contribute toward the expansion of the effective light emitting area.

In addition, electrical characteristics of the substrate 51 used in the semiconductor light emitting device 50 may be freely selected. Namely, since the light emitting cell C is separated from the substrate 51 by means of the intermediate separation layer 53 having electrical insulation properties, even a substrate having conductivity may be used in the semiconductor light emitting device 50.

The intermediate separation layer 53 is made of a material different from that of the first conductivity-type semiconductor layer 54a, so it may serve as an etching stop layer. For example, the intermediate separation layer 53 and the first conductivity-type semiconductor layer 54a have different etching rates, based on which an etching depth required for forming the isolation region may be easily implemented.

The isolation region may be formed such that at least the intermediate separation layer is exposed. For example, the isolation region may be etched down to a partial region of the base semiconductor layer or deeper. This embodiment is illustrated in FIG. 6.

Figure 6:
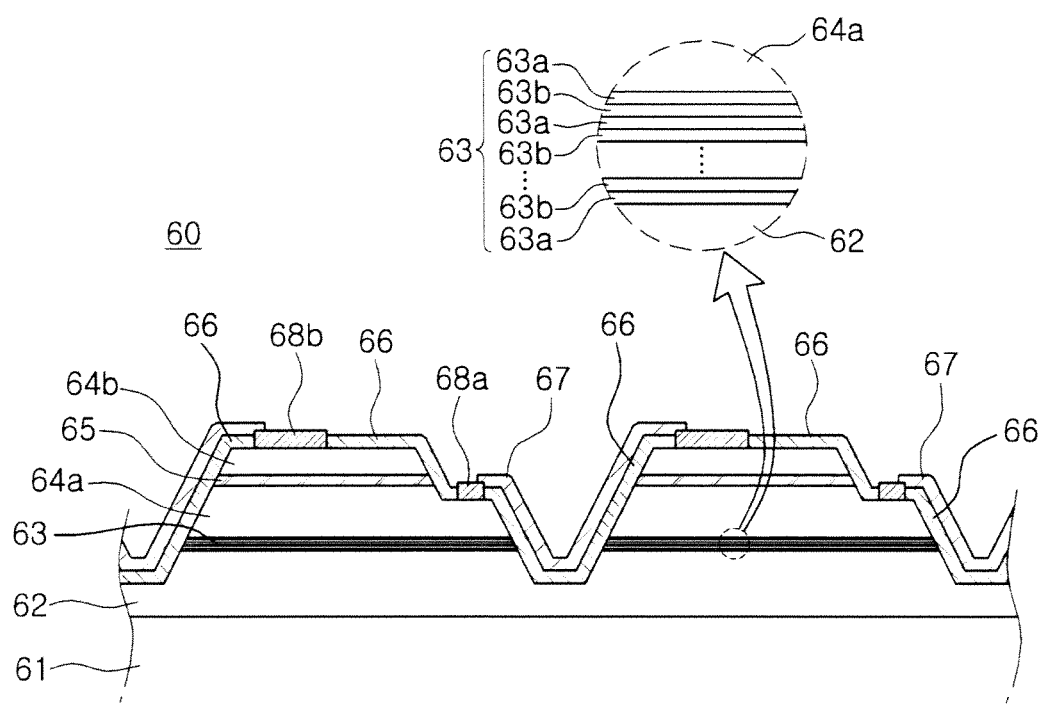
FIG. 6 is a cross sectional view of a semiconductor light emitting device according to another embodiment of the present disclosure.

A semiconductor light emitting device 60 illustrated in FIG. 6 includes a substrate 61 and a plurality of light emitting cells C formed thereon. Similar to the former embodiment, the plurality of light emitting cells C may be obtained by separating a semiconductor laminate including a base semiconductor layer 62, a first conductivity-type semiconductor layer 64a, an active layer 65, and a second conductivity-type semiconductor layer 64b sequentially formed on an upper surface of the substrate 61.

The semiconductor laminate employed in the present embodiment includes an intermediate separation layer 63 formed between the base semiconductor layer 62 and the first conductivity-type semiconductor layer 64a. The intermediate separation layer 63 may be a material layer having an energy band gap equal to or greater than that of the first conductivity-type semiconductor layer 64a to separate the base semiconductor layer 62 and the first conductivity-type semiconductor layer 64a.

The intermediate separation layer 63 employed in the present embodiment may have a structure in which two types of thin film, i.e., first and second thin films 63a and 63b, having different respective refractive indices, are repeatedly alternately stacked. The first and second thin films 63a and 63b may be nitride thin films having different respective compositions. For example, when the first and second thin films 63a and 63b are nitride thin films, they may have a different aluminum (Al) content to have different refractive indices. In this manner, the intermediate separation layer 63 may have a distributed Bragg reflector (DBR) structure to act as a reflective film as well as having an insulation function, thus increasing light extraction efficiency.

The plurality of light emitting cells C include first and second electrodes 68a and 68b connected to the first and second conductivity-type semiconductor layers 64a and 64b, respectively. The first and second electrodes 68a and 68b of adjacent light emitting cells C may be connected by a wiring unit 67, and in order to prevent an undesired region of each light emitting cell C and the wiring unit 67 from being connected to each other, an insulating layer 66 may be formed on the surface of each light emitting cell C.

In the present embodiment, an isolation region for forming the plurality of light emitting cells C may be formed down to a partial region of the base semiconductor layer 62. Even in the case that the base semiconductor layer 62 has conductivity, since the insulating layer 66 extends to an upper surface of an exposed region of the base semiconductor layer 62, an undesired connection between the wiring unit 67 and the base semiconductor layer 62 can be prevented.

The present disclosure may be implemented in various embodiments including embodiments having various other characteristic factors as well as an array of the light emitting cells. One such embodiment is illustrated in FIG. 7.

Figure 7:
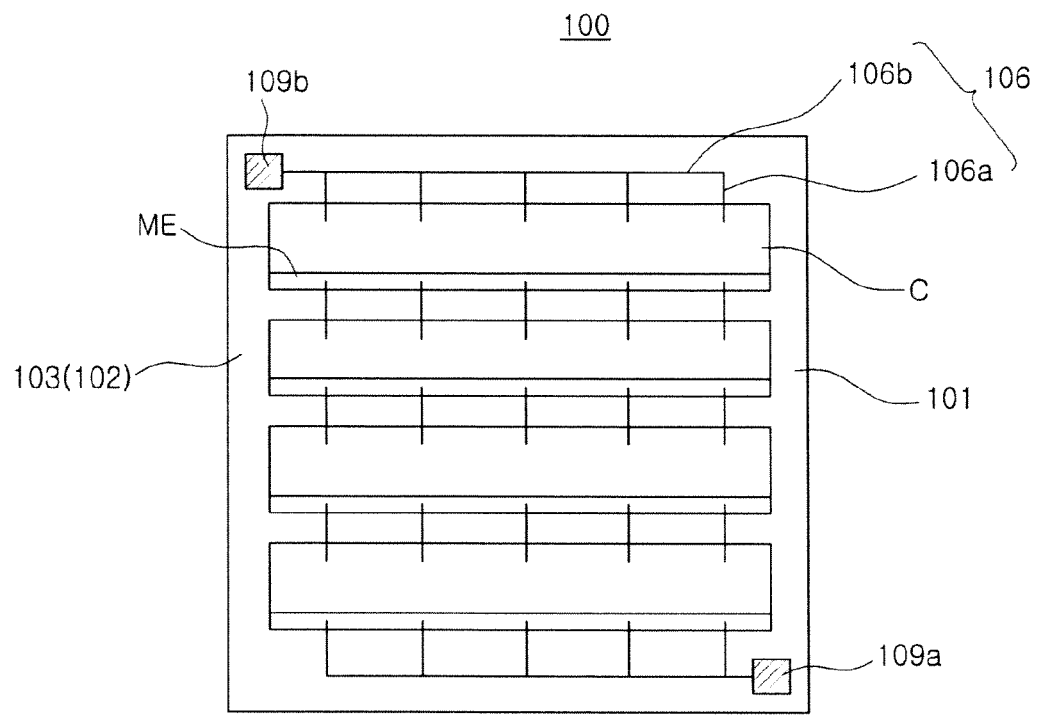
FIG. 7 is a plan view of the semiconductor light emitting device according to another embodiment of the present disclosure.

A semiconductor light emitting device 100 illustrated in FIG. 7 includes a substrate 101 and four light emitting cells C arranged in a vertical direction on an upper surface of the substrate 101.

Although not shown, similar to those of the former embodiment, each light emitting cell employed in the present embodiment may include a semiconductor laminate having a base semiconductor layer 102, an intermediate separation layer 103, a first conductivity-type semiconductor layer, an active layer, and a second conductivity-type semiconductor layer sequentially formed on an upper surface of the substrate 101. As illustrated in FIGS. 3 and 7, the intermediate layer 102 or the base semiconductor layer 103 may be exposed by an isolation region.

However, unlike the light emitting cells of the former embodiment, each light emitting cell illustrated in FIG. 7 may have a structure including five first and second contacts. In this manner, various types of light emitting cell may be employed in an embodiment of the present disclosure, and like in the present embodiment, a single physically divided light emitting cell may include a plurality of first and second electrodes formed to be spaced apart from one another, so as to be independently driven as a plurality of different light emitting elements.

Figure 8:
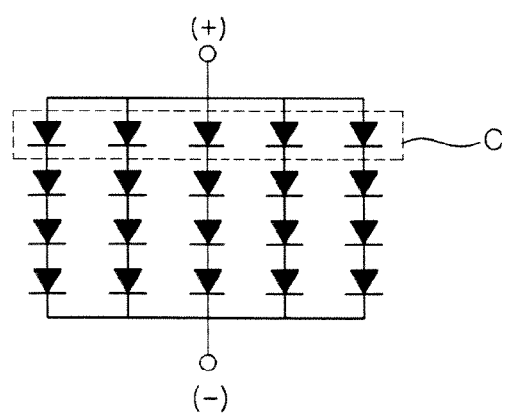
FIG. 8 is an equivalent circuit diagram of the semiconductor light emitting device illustrated in FIG. 7.

Namely, even in the case that the four physically separated light emitting cells are connected in series, each light emitting cell may act as five light emitting elements due to five contacts being spaced apart from one another, and a driving circuit thereof may be understood to have a 5×4 grid pattern as illustrated in FIG. 8.

The wiring unit 106 employed in the present embodiment may include a sub-connection wiring 106a directly connected to the light emitting cells C and a main connection wiring 106b connecting portions of the sub-connection wiring 106a to first and second bonding pads 109a and 109b.

Since the light emitting cells can be electrically separated even in the case that the semiconductor laminate is only separated to the degree that the intermediate separation layer 53 is exposed, the depth of an isolation groove can be reduced. In this manner, by employing the intermediate separation layer 53, the depth of an isolation groove may be reduced to increase an effective light emitting area of the semiconductor light emitting device 50, namely, the total of the respective cell active layer areas, and as a result, luminous efficiency can be significantly enhanced.

The foregoing semiconductor light emitting device is illustrated to have the light emitting cells in an array driven by a direct current (DC), but it may also be provided to have light emitting cells in an array that may be driven by an alternating current (AC).

Figures 9A, 9B:
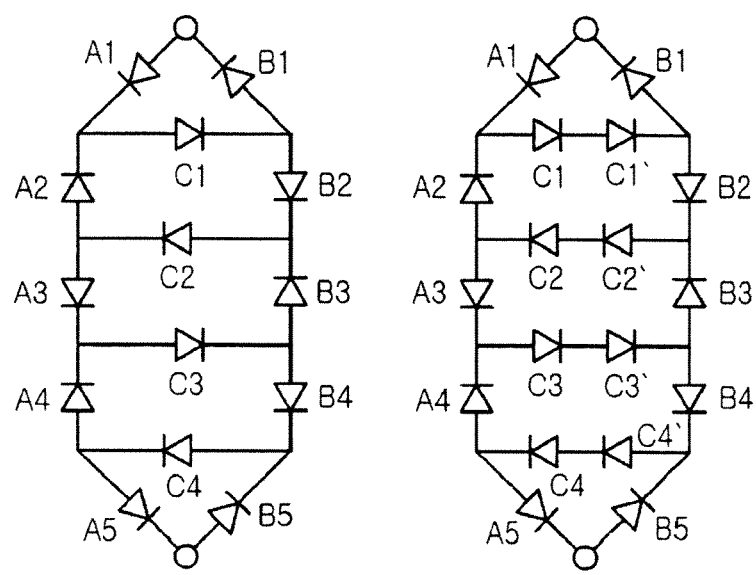
FIGS. 9A and 9B are views showing examples of equivalent circuit diagrams of a semiconductor light emitting device that may be employed in an embodiment of the present disclosure.

For example, the light emitting cells of the semiconductor light emitting device may be arranged to have LED driving circuits so as to be provided as an AC driven-type semiconductor light emitting device, as illustrated in FIGS. 9A and 9B.

In the LED driving circuit illustrated in FIG. 9A, one LED device disposed in each branch and first and second current loops driven in each half period of an application of AC voltage are formed. Namely, in the first half period of an application of AC voltage, the corresponding LED devices are arranged in series to form a first current loop along A1-C1-B2-C2-A3-C3-B4-C4-A5, and in a second half period of the AC voltage, the corresponding LED devices are arranged in series to form a second current loop along B1-C1-A2-C2-B3-C3-A4-C4-B5.

In the LED driving circuit according to the present embodiment, four LED devices C1, C2, C3, and C4, positioned in an intermediate branch to commonly participate in the first and second loops, may continuously operate in the entire period of the application of AC voltage.

In the driving circuit illustrated in FIG. 9A, the first and second branches and the intermediate branch include one LED device, respectively, but alternatively, each of the branches may include a plurality of LED devices. In this case, however, a plurality of LED devices belonging to the same branch may be connected in series.

In particular, in case that the number of LEDs of the intermediate branch is increased, the number of LEDs commonly driven in the entire half periods will be increased to drastically enhance luminous efficiency over the number of the LEDs in use, and as a result, the number of LEDs used to obtain a desired level of light emission with an AC voltage can be reduced.

An LED driving circuit illustrated in FIG. 9B has the same configuration as that of the LED driving circuit illustrated in FIG. 9A, except that two LED devices are disposed to be connected in series in each intermediate branch.

In the first half period of an application of AC voltage, the corresponding LED devices are arranged in series to form a first current loop along A1-C1-C1'-B2-C2'-C2-A3-C3-C3'-B4-C4'-C4-A5, and in a second half period of the AC voltage, the corresponding LED devices are arranged in series to form a second current loop along B1-C1'-C1-A2-C2-C2'-B3-C3'-C3-A4-C4-C4'-B5.

In the LED driving circuit according to the present embodiment, eight LED devices C1, C1', C2, C2', C3, C3', C4, and C4' belong to the intermediate branch. Namely, the number of the LED devices C1, C1', C2, C2', C3, C3', C4, and C4' commonly participating in the first and second current loops to continuously operate in the entire period of an application of AC voltage may be increased double that of the LED driving circuit illustrated in FIG. 9A.

The multi-chip array semiconductor light emitting device according to various embodiments of the present disclosure may be advantageously used as a chip in various types of modules including a base substrate having an electrode unit, such as a printed circuit board. Also, various light emitting devices and light emitting modules as described above may be implemented as an illumination apparatus including a driving unit.

Figure 10:
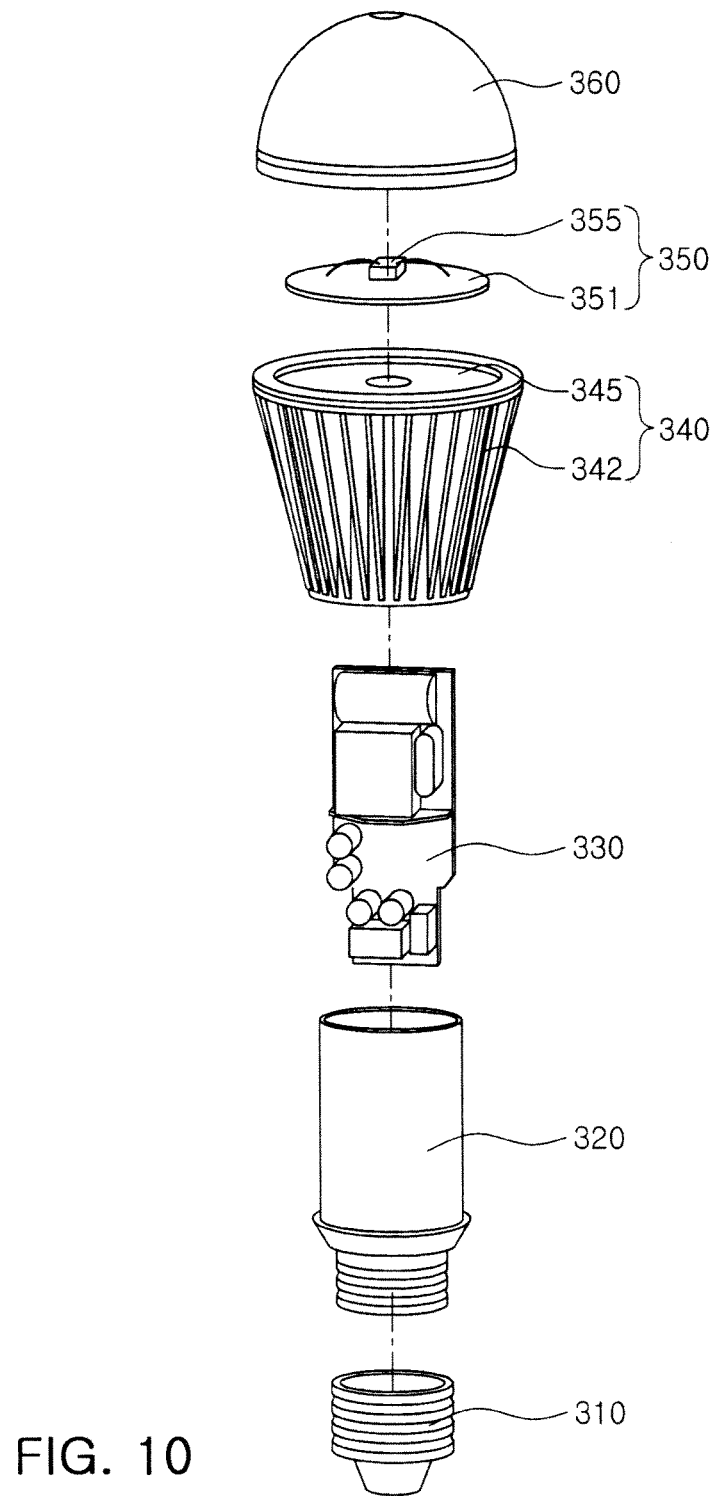
FIGS. 10 and 11 are an exploded perspective view and a schematic perspective view (depicting an assembled state) illustrating an illumination apparatus having a semiconductor light emitting device according to an embodiment of the present disclosure, respectively.
Figure 11:
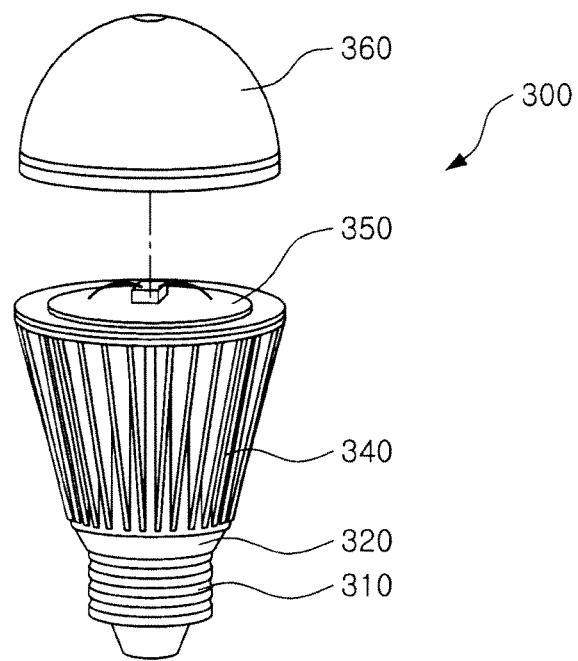

FIGS. 10 and 11 illustrate a bulb-type lamp as an example of an illumination apparatus according to an embodiment of the present disclosure. Specifically, FIG. 10 is an exploded perspective view illustrating each component to facilitate understanding of the configuration of the illumination apparatus, and FIG. 11 is a perspective view illustrating an assembled state (excluding a convex lens-type cover) of the components of FIG. 10.

With reference to FIGS. 10 and 11, an illumination apparatus 300 includes a light emitting module 350, a driving unit 330, and an external connection unit 310. The illumination apparatus 300 may further include external structures such as external and internal housings 340 and 320 and a cover unit 360.

The light emitting module 350 may have a semiconductor light emitting device 355 as described above, and a circuit board 351 on which the light emitting device 355 is mounted. In the present embodiment, a single semiconductor light emitting device 355 is illustrated as being mounted on the circuit board 351, but the present disclosure is not limited thereto and a plurality of semiconductor light emitting devices may be mounted as necessary.

In the illumination apparatus 300 according to the present embodiment, the light emitting module 350 may include the external housing 340 serving as a heat dissipation unit. The external housing 340 may include a heat dissipation plate 345 directly connected to the light emitting module 350 to enhance a heat dissipation effect. Also, the illumination apparatus 300 may include the cover unit 360 mounted on the light emitting module 350 and having a convex lens shape.

In the present embodiment, the driving unit 330 may be installed in the internal housing 320 and connected to the external connection unit 310 having a structure such as a socket structure to receive power from an external power source.

Also, the driving unit 330 serves to convert received power into an appropriate current source for driving the semiconductor light emitting device 355 of the light emitting module 350. For example, the driving unit 330 may be configured as an AC-DC converter, a rectifier circuit component, or the like.

In this manner, the foregoing light emitting device and light emitting module may be variably implemented in devices including indoor illumination apparatuses such as a lamp, or the like, outdoor illumination apparatuses such as a streetlight, an advertising sign, a beacon light, or the like, and illumination apparatuses for use in vehicular transportation such as a head lamp, a taillight, or the like, for automobiles, airplanes and ships. Also, the illumination apparatus may additionally include a structure such as a heat dissipation member and/or a reflecting plate, or the like.

As set forth above, according to embodiments of the disclosure, by introducing the intermediate separation layer having electrical insulation properties to the semiconductor laminate for a light emitting cell, the effective light emitting area (e.g., the active layer) otherwise reduced due to an isolation process between cells can be minimized, and thus, luminance efficiency can be enhanced.

In addition, substrates having various electrical characteristics may be freely selected to be used in a light emitting device. Namely, even in the case that a substrate has conductivity, it may be employed in a light emitting device because light emitting cells can be separated from the substrate by the intermediate separation layer having electrical insulation properties.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device comprising:
   a substrate;
   a semiconductor laminate having a base semiconductor layer, a first conductivity-type semiconductor layer, an active layer, and a second conductivity-type semiconductor layer sequentially formed on the substrate and divided by an isolation region to provide a plurality of light emitting cells;
   an intermediate separation layer interposed between the base semiconductor layer and the first conductivity-type semiconductor layer in order to electrically separate the base semiconductor layer and the first conductivity-type semiconductor layer;
   a plurality of first and second electrodes connected to the first and second conductivity-type semiconductor layers, respectively, of the plurality of light emitting cells; and
   a wiring unit connecting the first and second electrodes of different light emitting cells such that the plurality of light emitting cells are connected
   wherein the intermediate separation layer is a nitride layer co-doped with carbon (C) and silicon (Si).

2. The semiconductor light emitting device of claim 1, wherein the intermediate separation layer is a material layer having an energy band gap equal to or greater than that of the first conductivity-type semiconductor layer.

3. The semiconductor light emitting device of claim 2, wherein the semiconductor laminate is a nitride semiconductor, and the intermediate separation layer is a nitride layer having an energy band gap equal to or greater than that of the first conductivity-type semiconductor layer.

4. The semiconductor light emitting device of claim 3, wherein the intermediate separation layer is a nitride layer satisfying $Al_xGa_{1-x}N$ ($0.3 \leq x \leq 1$).

5. The semiconductor light emitting device of claim 3, wherein the base semiconductor layer includes an intentionally undoped semiconductor layer.

6. The semiconductor light emitting device of claim 3, wherein the base semiconductor layer comprises the same material as the first conductivity-type semiconductor layer.

7. The semiconductor light emitting device of claim 3, wherein the base semiconductor layer and the first conductivity-type semiconductor layer are n-type nitride semiconductor layers.

8. The semiconductor light emitting device of claim 3, wherein the isolation region is formed such that at least the intermediate separation layer is exposed.

9. The semiconductor light emitting device of claim 1, wherein the intermediate separation layer has a structure in which two types of thin films, having different respective refractive indices, are repeatedly alternately stacked.

10. The semiconductor light emitting device of claim 9, wherein the two types of thin film are nitride thin films.

11. The semiconductor light emitting device of claim 1, wherein an insulating layer is formed on a lateral surface of each light emitting cell to prevent the wiring unit and an undesired region of each light emitting cell from being electrically connected.

12. The semiconductor light emitting device of claim 1, wherein the wiring unit connects the plurality of light emitting cells to allow the plurality of light emitting cells to be driven at a DC voltage.

13. The semiconductor light emitting device of claim 1, wherein the wiring unit connects the plurality of light emitting cells to allow the plurality of light emitting cells to be driven at an AC voltage.

14. The semiconductor light emitting device of claim 1, further comprising first and second bonding pads,
wherein the wiring unit includes a sub-connection wiring connected to any one of the first and second electrodes of the plurality of light emitting cells and a main connection wiring connecting the sub-connection wiring and the first or second bonding pad.

15. The semiconductor light emitting device of claim 1, wherein the substrate is a conductive substrate or an insulating substrate.

16. The semiconductor light emitting device of claim 1, wherein each of the plurality of light emitting cells includes a plurality of first and second electrodes.

17. A light emitting module comprising at least one semiconductor light emitting device described in claim 1.

18. An illumination apparatus comprising the light emitting module described in claim 17.

19. An illumination apparatus comprising at least one semiconductor light emitting device described in claim 1.

20. The semiconductor light emitting device of claim 1, wherein the intermediate separation layer is further doped with at least one element selected from the group consisting of iron (Fe), chromium (Cr), zinc (Zn), oxygen (O), and hydrogen (H).

* * * * *